United States Patent
Park et al.

(10) Patent No.: US 11,700,015 B2
(45) Date of Patent: *Jul. 11, 2023

(54) BIT INTERLEAVER FOR LOW-DENSITY PARITY CHECK CODEWORD HAVING LENGTH OF 16200 AND CODE RATE OF 3/15 AND 64-SYMBOL MAPPING, AND BIT INTERLEAVING METHOD USING SAME

(71) Applicant: ELECTRONICS AND TELECOMMUNICATIONS RESEARCH INSTITUTE, Daejeon (KR)

(72) Inventors: Sung-Ik Park, Daejeon (KR); Sun-Hyoung Kwon, Daejeon (KR); Bo-Mi Lim, Daejeon (KR); Jae-Young Lee, Daejeon (KR); Heung-Mook Kim, Daejeon (KR); Nam-Ho Hur, Sejong-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/500,848

(22) Filed: Oct. 13, 2021

(65) Prior Publication Data

US 2022/0052708 A1    Feb. 17, 2022

Related U.S. Application Data

(63) Continuation of application No. 16/435,283, filed on Jun. 7, 2019, now Pat. No. 11,177,829, which is a
(Continued)

(30) Foreign Application Priority Data

May 22, 2014 (KR) .................. 10-2014-0061874
Jan. 20, 2015 (KR) .................. 10-2015-0009141

(51) Int. Cl.
*H03M 13/00* (2006.01)
*H03M 13/11* (2006.01)
(Continued)

(52) U.S. Cl.
CPC ..... *H03M 13/1102* (2013.01); *G06F 11/1076* (2013.01); *H03M 13/116* (2013.01);
(Continued)

(58) Field of Classification Search
CPC ............ H03M 13/27; H03M 13/255; H03M 13/1102; G11B 20/1806; G11B 20/1809; G11B 2020/185; G06F 11/1076
(Continued)

(56) References Cited

U.S. PATENT DOCUMENTS

2004/0086059 A1    5/2004   Eroz et al.
2011/0075710 A1    3/2011   Park et al.
(Continued)

FOREIGN PATENT DOCUMENTS

EP    2525495 A1    11/2012

OTHER PUBLICATIONS

"Digital Video Broadcasting (DVB): Next Generation broadcasting system to Handheld, physical layer specification (DVB-NGH)", DVB document A160, Nov. 2012, pp. 1-295.
(Continued)

*Primary Examiner* — Albert Decady
*Assistant Examiner* — Osman M Alshack

(57) ABSTRACT

A bit interleaver, a bit-interleaved coded modulation (BICM) device and a bit interleaving method are disclosed herein. The bit interleaver includes a first memory, a processor, and a second memory. The first memory stores a low-density parity check (LDPC) codeword having a length of 16200 and a code rate of 3/15. The processor generates an interleaved codeword by interleaving the LDPC codeword
(Continued)

on a bit group basis. The size of the bit group corresponds to a parallel factor of the LDPC codeword. The second memory provides the interleaved codeword to a modulator for 64-symbol mapping.

6 Claims, 6 Drawing Sheets

Related U.S. Application Data continuation of application No. 14/717,174, filed on May 20, 2015, now Pat. No. 10,361,720.

(51) Int. Cl.
*H03M 13/25* (2006.01)
*H03M 13/27* (2006.01)
*G06F 11/10* (2006.01)

(52) U.S. Cl.
CPC ..... *H03M 13/1185* (2013.01); *H03M 13/255* (2013.01); *H03M 13/2778* (2013.01)

(58) Field of Classification Search
USPC ................ 714/766, 800, 801, 803, 804, 805
See application file for complete search history.

(56) References Cited

U.S. PATENT DOCUMENTS

| | | |
|---|---|---|
| 2011/0090948 A1 | 4/2011 | Zhou et al. |
| 2011/0167317 A1 | 7/2011 | Kim et al. |
| 2012/0134446 A1 | 5/2012 | Zhou et al. |
| 2013/0142219 A1 | 6/2013 | Park et al. |
| 2013/0216001 A1* | 8/2013 | Petrov ................. H03M 13/036 375/299 |
| 2013/0227378 A1* | 8/2013 | Yamamoto .......... H03M 13/356 714/776 |
| 2013/0254617 A1 | 9/2013 | Shinohara et al. |
| 2013/0290816 A1* | 10/2013 | Shinohara ......... H03M 13/2906 714/776 |
| 2013/0305113 A1* | 11/2013 | Shinohara ............. H04L 1/0041 714/752 |
| 2013/0311850 A1* | 11/2013 | Shinohara ............. H04L 1/0057 714/758 |
| 2015/0051460 A1 | 2/2015 | Saxena et al. |
| 2015/0236721 A1* | 8/2015 | Kim .................... H03M 13/271 714/776 |
| 2015/0236816 A1* | 8/2015 | Myung ............. H03M 13/2778 714/776 |
| 2015/0270853 A1* | 9/2015 | Jeong ..................... H04L 27/38 714/752 |
| 2016/0204804 A1* | 7/2016 | Ikegaya ............ H03M 13/2707 714/752 |
| 2016/0218824 A1* | 7/2016 | Kim ..................... H04L 1/0068 |
| 2017/0162077 A1 | 6/2017 | Vara et al. |

OTHER PUBLICATIONS

"Digital Video Broadcasting (DVB): Frame structure channel coding and modulation for a second generation digital terrestrial television broadcasting system," DVB Document A182, Jun. 2022.

* cited by examiner

BIT INTERLEAVER FOR LOW-DENSITY PARITY CHECK CODEWORD HAVING LENGTH OF 16200 AND CODE RATE OF 3/15 AND 64-SYMBOL MAPPING, AND BIT INTERLEAVING METHOD USING SAME

CROSS-REFERENCE TO RELATED APPLICATIONS

This application is a continuation of U.S. application Ser. No. 16/435,283, filed Jun. 7, 2019, now U.S. Pat. No. 11,177,829, which is a continuation of U.S. application Ser. No. 14/717,174, filed May 20, 2015, now U.S. Pat. No. 10,361,720, which claims the benefit of Korean Patent Application Nos. 10-2014-0061874 and 10-2015-0009141, filed May 22, 2014 and Jan. 20, 2015, which are hereby incorporated by reference herein in their entirety.

BACKGROUND

1. Technical Field

The present disclosure relates generally to an interleaver and, more particularly, to a bit interleaver that is capable of distributing burst errors occurring in a digital broadcast channel.

2. Description of the Related Art

Bit-Interleaved Coded Modulation (BICM) is bandwidth-efficient transmission technology, and is implemented in such a manner that an error-correction coder, a bit-by-bit interleaver and a high-order modulator are combined with one another.

BICM can provide excellent performance using a simple structure because it uses a low-density parity check (LDPC) coder or a Turbo coder as the error-correction coder. Furthermore, BICM can provide high-level flexibility because it can select modulation order and the length and code rate of an error correction code in various forms. Due to these advantages, BICM has been used in broadcasting standards, such as DVB-T2 and DVB-NGH, and has a strong possibility of being used in other next-generation broadcasting systems.

However, in spite of those advantages, BICM suffers from the rapid degradation of performance unless burst errors occurring in a channel are appropriately distributed via the bit-by-bit interleaver. Accordingly, the bit-by-bit interleaver used in BICM should be designed to be optimized for the modulation order or the length and code rate of the error correction code.

SUMMARY

At least one embodiment of the present invention is directed to the provision of an intra-BICM bit interleaver that can effectively distribute burst errors occurring in a broadcasting system channel.

At least one embodiment of the present invention is directed to the provision of a bit interleaver that is optimized for an LDPC coder having a length of 16200 and a code rate of 3/15 and a modulator performing 64-symbol mapping and, thus, can be applied to next-generation broadcasting systems, such as ATSC 3.0.

In accordance with an aspect of the present invention, there is provided a bit interleaver, including a first memory configured to store a low-density parity check (LDPC) codeword having a length of 16200 and a code rate of 3/15; a processor configured to generate an interleaved codeword by interleaving the LDPC codeword on a bit group basis, the size of the bit group corresponding to a parallel factor of the LDPC codeword; and a second memory configured to provide the interleaved codeword to a modulator for 64-symbol mapping.

The 64-symbol mapping may be NUC (Non-Uniform Constellation) symbol mapping corresponding to 64 constellations (symbols).

The parallel factor may be 360, and each of the bit groups may include 360 bits.

The LDPC codeword may be represented by ($u_0, u_1, \ldots, u_{N_{ldpc}-1}$) (where $N_{ldpc}$ is 16200), and may be divided into 45 bit groups each including 360 bits, as in the following equation:

$$X_j = \{u_k | 360 \times j \leq k < 360 \times (j+1), 0 \leq k < N_{ldpc}\} \text{ for } 0 \leq j < N_{group}$$

where $X_j$ is an j-th bit group, $N_{ldpc}$ is 16200, and $N_{group}$ is 45.

The interleaving may be performed using the following equation using permutation order:

$$Y_j = X_{\pi(j)} \; 0 \leq j \leq N_{group}$$

where $X_j$ is the j-th bit group, $Y_j$ is an interleaved j-th bit group, and $\pi(j)$ is a permutation order for bit group-based interleaving (bit group-unit interleaving).

The permutation order may correspond to an interleaving sequence represented by the following equation:

interleaving sequence={19 34 22 6 29 25 23 36 7 8 24 16 27 43 11 35 5 28 13 4 3 17 15 38 20 0 26 12 1 39 31 41 44 30 9 21 42 18 14 32 10 2 37 33 40}

In accordance with another aspect of the present invention, there is provided a bit interleaving method, including storing an LDPC codeword having a length of 16200 and a code rate of 3/15; generating an interleaved codeword by interleaving the LDPC codeword on a bit group basis corresponding to the parallel factor of the LDPC codeword; and outputting the interleaved codeword to a modulator for 64-symbol mapping.

In accordance with still another aspect of the present invention, there is provided a BICM device, including an error-correction coder configured to output an LDPC codeword having a length of 16200 and a code rate of 3/15; a bit interleaver configured to interleave the LDPC codeword on a bit group basis corresponding to the parallel factor of the LDPC codeword and output the interleaved codeword; and a modulator configured to perform 64-symbol mapping on the interleaved codeword.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
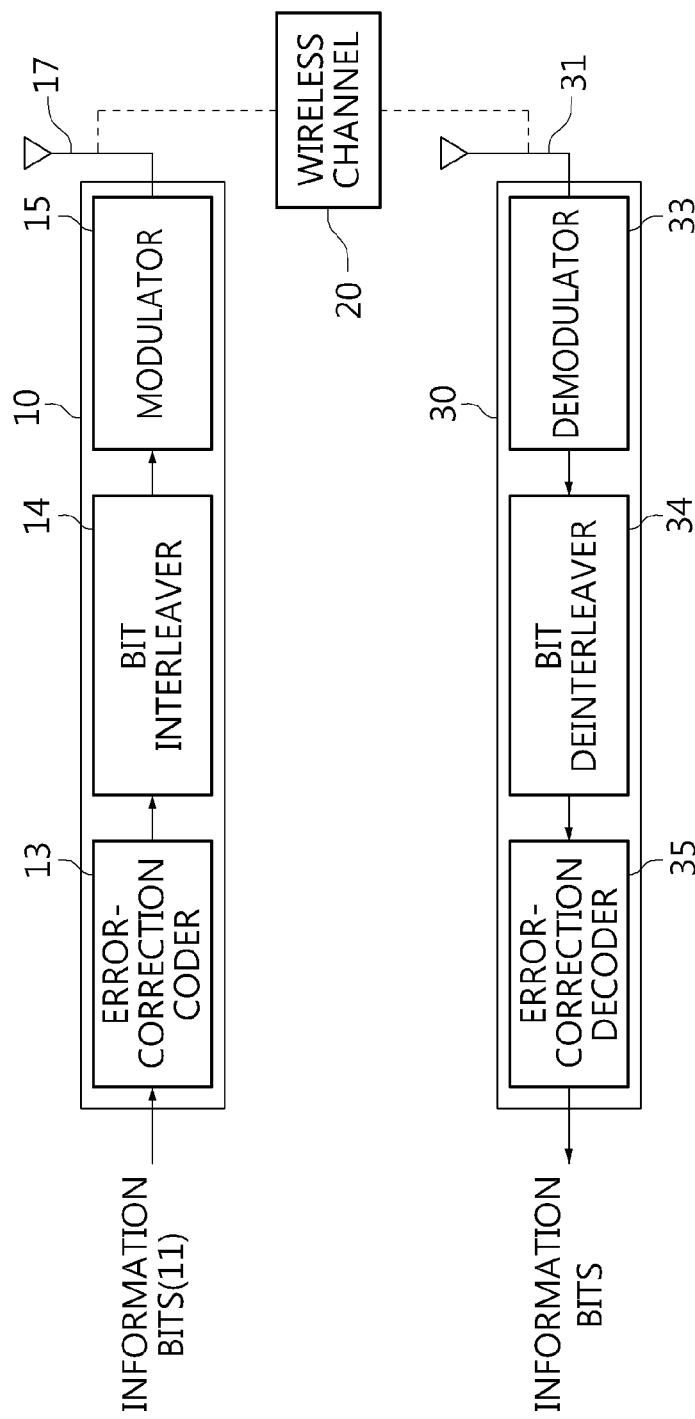
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a BICM device 10 and a BICM reception device 30 communicate with each other over a wireless channel 20.

The BICM device 10 generates an n-bit codeword by encoding k information bits 11 using an error-correction coder 13. In this case, the error-correction coder 13 may be an LDPC coder or a Turbo coder.

The codeword is interleaved by a bit interleaver 14, and thus the interleaved codeword is generated.

In this case, the interleaving may be performed on a bit group basis (by a unit of a bit group). In this case, the error-correction coder 13 may be an LDPC coder having a length of 16200 and a code rate of 3/15. A codeword having a length of 16200 may be divided into a total of 45 bit groups. Each of the bit groups may include 360 bits, i.e., the parallel factor of an LDPC codeword.

In this case, the interleaving may be performed on a bit group basis (by a unit of a bit group) in accordance with an interleaving sequence, which will be described later.

In this case, the bit interleaver 14 prevents the performance of error correction code from being degraded by effectively distributing burst errors occurring in a channel. In this case, the bit interleaver 14 may be separately designed in accordance with the length and code rate of the error correction code and the modulation order.

The interleaved codeword is modulated by a modulator 15, and is then transmitted via an antenna 17.

In this case, the modulator 15 may be based on a concept including symbol mapper (symbol mapping device). In this case, the modulator 15 may be a symbol mapping device performing 64-symbol mapping which maps codes onto 64 constellations (symbols).

In this case, the modulator 15 may be a uniform modulator, such as a quadrature amplitude modulation (QAM) modulator, or a non-uniform modulator.

The modulator 15 may be a symbol mapping device performing NUC (Non-Uniform Constellation) symbol mapping which uses 64 constellations (symbols).

The signal transmitted via the wireless channel 20 is received via the antenna 31 of the BICM reception device 30, and, in the BICM reception device 30, is subjected to a process reverse to the process in the BICM device 10. That is, the received data is demodulated by a demodulator 33, is deinterleaved by a bit deinterleaver 34, and is then decoded by an error correction decoder 35, thereby finally restoring the information bits.

It will be apparent to those skilled in the art that the above-described transmission and reception processes have been described within a minimum range required for a description of the features of the present invention and various processes required for data transmission may be added.

Figure 2:
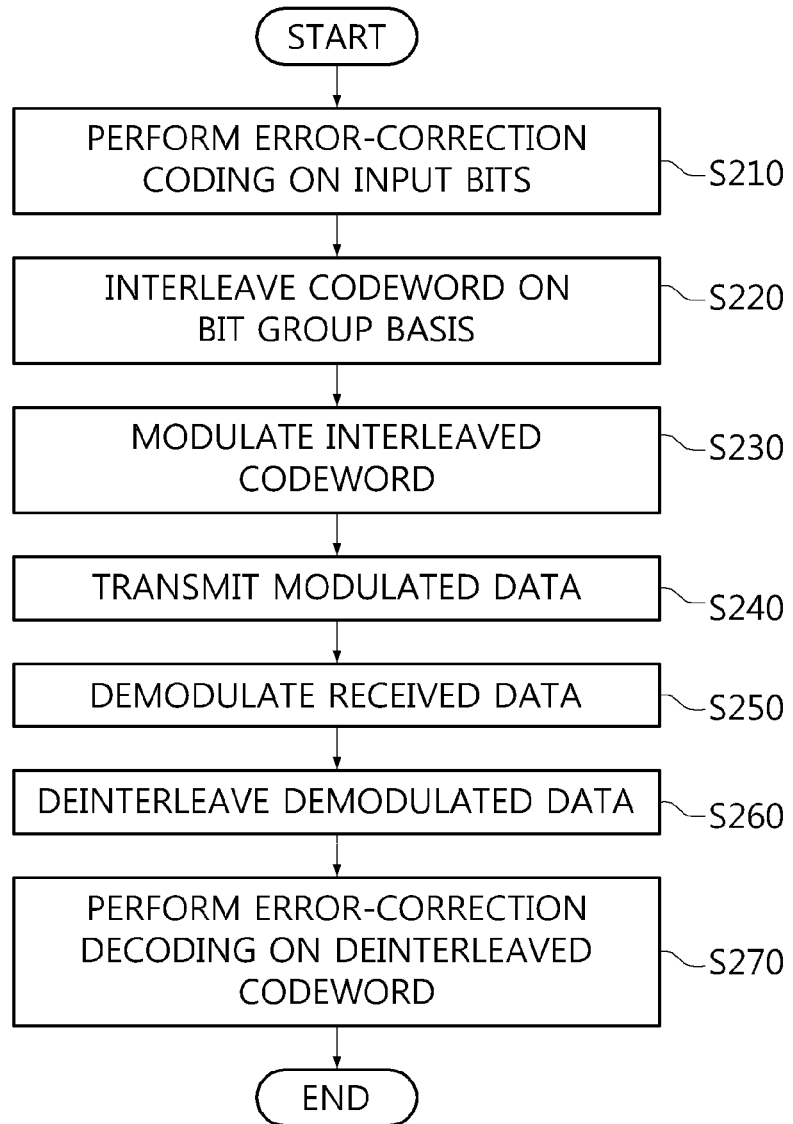
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to error-correction coding at step S210.

That is, at step S210, an n-bit codeword is generated by encoding k information bits using the error-correction coder.

In this case, step S210 may be performed as in an LDPC encoding method, which will be described later.

Furthermore, in the broadcast signal transmission and reception method, an interleaved codeword is generated by interleaving the n-bit codeword on a bit group basis at step S220.

In this case, the n-bit codeword may be an LDPC codeword having a length of 16200 and a code rate of 3/15. The codeword having a length of 16200 may be divided into a total of 45 bit groups. Each of the bit groups may include 360 bits corresponding to the parallel factors of an LDPC codeword.

In this case, the interleaving may be performed on a bit group basis (by a unit of a bit group) in accordance with an interleaving sequence, which will be described later.

Furthermore, in the broadcast signal transmission and reception method, the encoded data is modulated at step S230.

That is, at step S230, the interleaved codeword is modulated using the modulator.

In this case, the modulator may be based on a concept including symbol mapper (symbol mapping device). In this case, the modulator may be a symbol mapping device performing 64-symbol mapping which maps codes onto 64 constellations (symbols).

In this case, the modulator may be a uniform modulator, such as a QAM modulator, or a non-uniform modulator.

The modulator may be a symbol mapping device performing NUC (Non-Uniform Constellation) symbol mapping which uses 64 constellations (symbols).

Furthermore, in the broadcast signal transmission and reception method, the modulated data is transmitted at step S240.

That is, at step S240, the modulated codeword is transmitted over the wireless channel via the antenna.

Furthermore, in the broadcast signal transmission and reception method, the received data is demodulated at step S250.

That is, at step S250, the signal transmitted over the wireless channel is received via the antenna of the receiver, and the received data is demodulated using the demodulator.

Furthermore, in the broadcast signal transmission and reception method, the demodulated data is deinterleaved at step S260. In this case, the deinterleaving of step S260 may be reverse to the operation of step S220.

Furthermore, in the broadcast signal transmission and reception method, the deinterleaved codeword is subjected to error correction decoding at step S270.

That is, at step S270, the information bits are finally restored by performing error correction decoding using the error correction decoder of the receiver.

In this case, step S270 corresponds to a process reverse to that of an LDPC encoding method, which will be described later.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \cdots & J^{a_{1n}} \\ J^{a_{21}} & J^{a_{22}} & \cdots & J^{a_{2n}} \\ \vdots & \vdots & \ddots & \vdots \\ J^{a_{m1}} & J^{a_{m2}} & \cdots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix} \quad (2)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
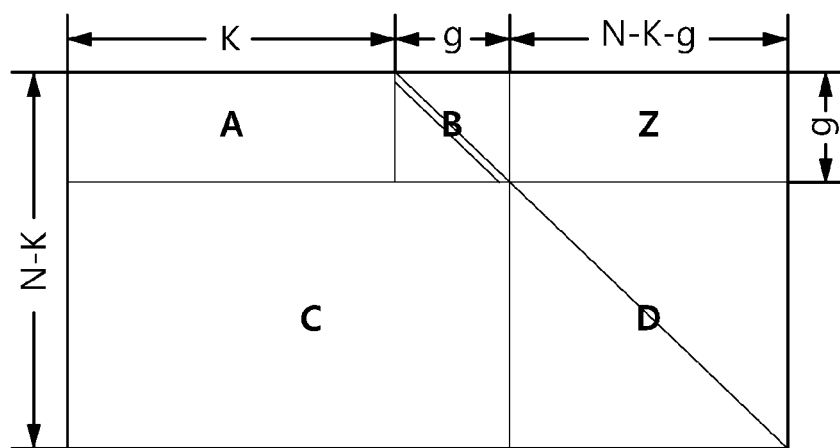
FIG. 3 is a diagram illustrating the structure of a parity check matrix (PCM) corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)× (N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix} \quad (3)$$

where $L_{L \times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 3/15 and the length of a codeword is 16200, as illustrated in the following Table 1. That is, the present invention proposes an LDPC code that is designed to receive information having a length of 3240 and generate an LDPC codeword having a length of 16200.

Table 1 illustrates the sizes of the matrices A, B, C, D and Z of the QC-LDPC code according to the present invention:

TABLE 1

| | | Sizes | | | | |
|---|---|---|---|---|---|---|
| Code rate | Length | A | B | C | D | Z |
| 3/15 | 16200 | 1080 × 3240 | 1080 × 1080 | 11880 × 4320 | 11880 × 11880 | 1080 × 11880 |

The newly designed LDPC code may be represented in the form of a sequence (progression), an equivalent relationship is established between the sequence and matrix (parity bit check matrix), and the sequence may be represented, as follows:

| SEQUENCE TABLE |
|---|
| 1st row: 8 372 841 4522 5253 7430 8542 9822 10550 11896 11988 |
| 2nd row: 80 255 667 1511 3549 5239 5422 5497 7157 7854 11267 |

-continued

SEQUENCE TABLE

3rd row: 257 406 792 2916 3072 3214 3638 4090 8175 8892 9003
4th row: 80 150 346 1883 6838 7818 9482 10366 10514 11468 12341
5th row: 32 100 978 3493 6751 7787 8496 10170 10318 10451 12561
6th row: 504 803 856 2048 6775 7631 8110 8221 8371 9443 10990
7th row: 152 283 696 1164 4514 4649 7260 7370 11925 11986 12092
8th row: 127 1034 1044 1842 3184 3397 5931 7577 11898 12339 12689
9th row: 107 513 979 3934 4374 4658 7286 7809 8830 10804 10893
10th row: 2045 2499 7197 8887 9420 9922 10132 10540 10816 11876
11st row: 2932 6241 7136 7835 8541 9403 9817 11679 12377 12810
12nd row: 2211 2288 3937 4310 5952 6597 9692 10445 11064 11272

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$\lambda_i = s_i$ for $i=0,1,\ldots,K-1$ $p_j=0$ for $j=0,1,\ldots,M_1+M_2-1$ \hfill (4)

First information bit $\lambda_0$ is accumulated at parity bit addresses specified in the 1st row of the sequence of the Sequence Table. For example, in an LDPC code having a length of 16200 and a code rate of 3/15, an accumulation process is as follows:

$p_8 = p_8 \oplus \lambda_0$ $p_{372} = p_{372} \oplus \lambda_0$ $p_{841} = p_{841} \oplus \lambda_0$ $p_{4522} = p_{4522} \oplus \lambda_0$ $p_{5253} = p_{5253} \oplus \lambda_0$ $p_{7430} = p_{7430} \oplus \lambda_0$ $p_{8542} = p_{8542} \oplus \lambda_0$ $p_{9822} = p_{9822} \oplus \lambda_0$ $p_{10550} = p_{10550} \oplus \lambda_0$ $p_{11896} = p_{11896} \oplus \lambda_0$ $p_{11988} = p_{11988} \oplus \lambda_0$ where the addition $\oplus$ occurs in GF(2).

The subsequent L−1 information bits, that is, $\lambda_m$, m= 1, 2, ..., L−1, are accumulated at parity bit addresses that are calculated by the following Equation 5:

$(x+m \times Q_1) \mod M_1$ if $x < M_1$ $M_1+\{(x-M_1+m \times Q_2) \mod M_2\}$ if $x \geq M_1$ \hfill (5)

where x denotes the addresses of parity bits corresponding to the first information bit $\lambda_0$, that is, the addresses of the parity bits specified in the first row of the sequence of the Sequence Table, $Q_1=M_1/L$, $Q_2=M_2/L$, and $L=360$. Furthermore, $Q_1$ and $Q_2$ are defined in the following Table 2. For example, for an LDPC code having a length of 16200 and a code rate of 3/15, $M_1=1080$, $Q_1=3$, $M_2=11880$, $Q_2=33$ and $L=360$, and the following operations are performed on the second bit $\lambda_1$ using Equation 5:

$p_{11} = p_{11} \oplus \lambda_1$ $p_{375} = p_{375} \oplus \lambda_1$ $p_{844} = p_{844} \oplus \lambda_1$ $p_{4555} = p_{4555} \oplus \lambda_1$ $p_{5286} = p_{5286} \oplus \lambda_1$ $p_{7463} = p_{7463} \oplus \lambda_1$ $p_{8575} = p_{8575} \oplus \lambda_1$ $p_{9855} = p_{9855} \oplus \lambda_1$ $p_{10583} = p_{10583} \oplus \lambda_1$ $p_{11929} = p_{11929} \oplus \lambda_1$ $p_{12021} = p_{12021} \oplus \lambda_1$ Table 2 illustrates the sizes of $M_1$, $Q_1$, $M_2$ and $Q_2$ of the designed QC-LDPC code:

TABLE 2

| | | Sizes | | | |
|---|---|---|---|---|---|
| Code rate | Length | $M_1$ | $M_2$ | $Q_1$ | $Q_2$ |
| 3/15 | 16200 | 1080 | 11880 | 3 | 33 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$p_i = p_i \oplus p_{i-1}$ for $i=0,1,\ldots,M_1-1$ \hfill (6)

Thereafter, when a parity interleaving operation, such as that of the following Equation 7, is performed, parity bits corresponding to the dual diagonal matrix B are generated:

$\lambda_{K+L \cdot t+s} = p_{Q_1 \cdot s+t}$ for $0 \leq s < L$, $0 \leq t < Q_1$ \hfill (7)

When the parity bits corresponding to the dual diagonal matrix B have been generated using K information bits $\lambda_0, \lambda_1, \ldots, \lambda_{K-1}$, parity bits corresponding to the identity matrix D are generated using the $M_1$ generated parity bits $\lambda_K, \lambda_{K+1}, \ldots, \lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+M_1-1}$ have been exhausted, parity bits corresponding to the identity matrix D are generated:

$$\lambda_{K+M_1+L \cdot t+s} = p_{M_1+Q_2 \cdot s+t} \text{ for } 0 \le s < L,\ 0 \le t < Q_2 \qquad (8)$$

Figure 4:
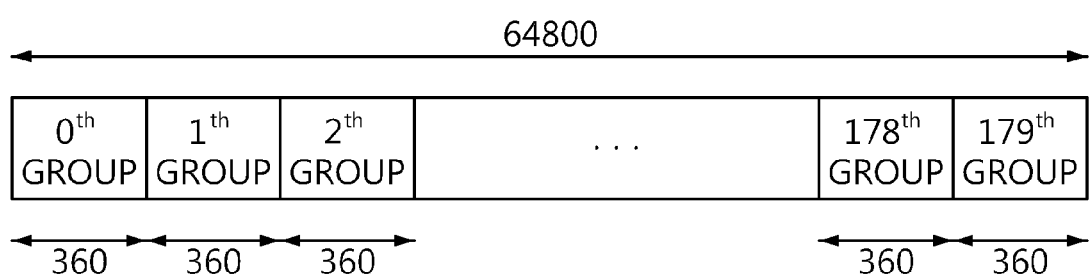
FIG. 4 is a diagram illustrating the bit groups of an LDPC codeword having a length of 64800.

FIG. 4 is a diagram illustrating the bit groups of an LDPC codeword having a length of 64800.

Referring to FIG. 4, it can be seen that an LDPC codeword having a length of 64800 is divided into 180 bit groups (a 0th group to a 179th group).

In this case, 360 may be the parallel factor (PF) of the LDPC codeword. That is, since the PF is 360, the LDPC codeword having a length of 64800 is divided into 180 bit groups, as illustrated in FIG. 4, and each of the bit groups includes 360 bits.

Figure 5:
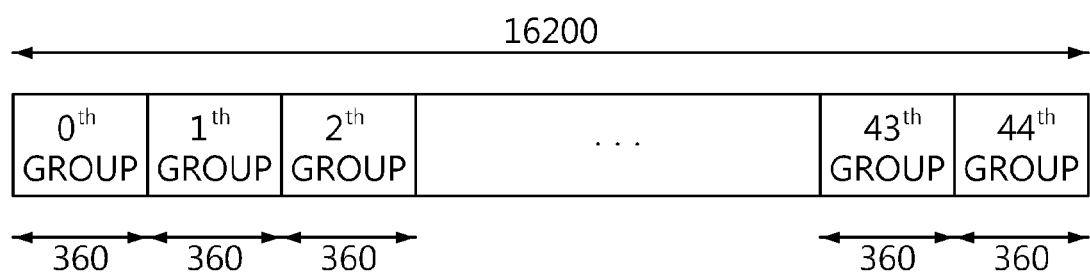
FIG. 5 is a diagram illustrating the bit groups of an LDPC codeword having a length of 16200.

FIG. 5 is a diagram illustrating the bit groups of an LDPC codeword having a length of 16200.

Referring to FIG. 5, it can be seen that an LDPC codeword having a length of 16200 is divided into 45 bit groups (a 0th group to a 44th group).

In this case, 360 may be the parallel factor (PF) of the LDPC codeword. That is, since the PF is 360, the LDPC codeword having a length of 16200 is divided into 45 bit groups, as illustrated in FIG. 5, and each of the bit groups includes 360 bits.

Figure 6:
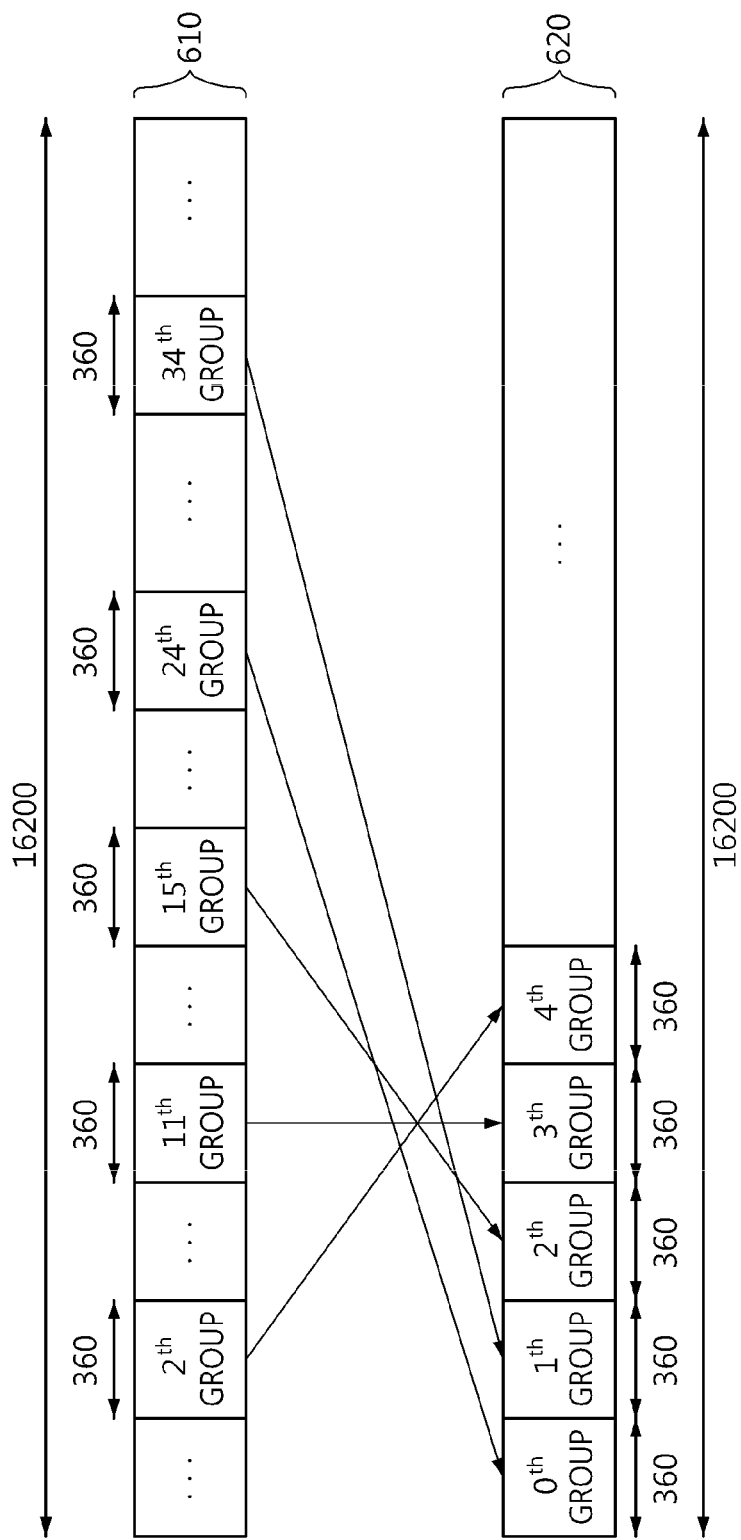
FIG. 6 is a diagram illustrating interleaving that is performed on a bit group basis in accordance with an interleaving sequence.

FIG. 6 is a diagram illustrating interleaving that is performed on a bit group basis in accordance with an interleaving sequence.

Referring to FIG. 6, it can be seen that interleaving is performed by changing the order of bit groups by a designed interleaving sequence.

For example, it is assumed that an interleaving sequence for an LDPC codeword having a length of 16200 is as follows:

interleaving sequence={24 34 15 11 2 28 17 25 5 38
19 13 6 39 1 14 33 37 29 12 42 31 30 32 36
40 26 35 44 4 16 8 20 43 21 7 0 18 23 3 10 41
9 27 22}

Then, the order of the bit groups of the LDPC codeword illustrated in FIG. 4 is changed into that illustrated in FIG. 6 by the interleaving sequence.

That is, it can be seen that each of the LDPC codeword 610 and the interleaved codeword 620 includes 45 bit groups, and it can be also seen that, by the interleaving sequence, the 24th bit group of the LDPC codeword 610 is changed into the 0th bit group of the interleaved LDPC codeword 620, the 34th bit group of the LDPC codeword 610 is changed into the 1st bit group of the interleaved LDPC codeword 620, the 15th bit group of the LDPC codeword 610 is changed into the 2nd bit group of the interleaved LDPC codeword 620, and the list bit group of the LDPC codeword 610 is changed into the 3rd bit group of the interleaved LDPC codeword 620, and the 2nd bit group of the LDPC codeword 610 is changed into the 4th bit group of the interleaved LDPC codeword 620.

An LDPC codeword $(u_0, u_1, \ldots, u_{N_{ldpc}-1})$ having a length of $N_{ldpc}$ ($N_{ldpc} = 16200$) is divided into $N_{group} = N_{ldpc}/360$ bit groups, as in Equation 9 below:

$$X_j = \{u_k | 360 \times j \le k < 360 \times (j+1), 0 \le k < N_{ldpc}\} \text{ for } 0 \le j < N_{group} \qquad (9)$$

where $X_j$ is an j-th bit group, and each $X_j$ is composed of 360 bits.

The LDPC codeword divided into the bit groups is interleaved, as in Equation 10 below:

$$Y_j = X_{\pi(j)} 0 \le j \le N_{group} \qquad (10)$$

where $Y_j$ is an interleaved j-th bit group, and $\pi(j)$ is a permutation order for bit group-based interleaving (bit group-unit interleaving). The permutation order corresponds to the interleaving sequence of Equation 11 below:

interleaving sequence={19 34 22 6 29 25 23 36 7 8
24 16 27 43 11 35 5 28 13 4 3 17 15 38 20 0
26 12 1 39 31 41 44 30 9 21 42 18 14 32 10 2
37 33 40} (11)

That is, when each of the codeword and the interleaved codeword includes 45 bit groups ranging from a 0th bit group to a 44th bit group, the interleaving sequence of Equation 11 means that the 19th bit group of the codeword becomes the 0th bit group of the interleaved codeword, the 34th bit group of the codeword becomes the 1st bit group of the interleaved codeword, the 22th bit group of the codeword becomes the 2nd bit group of the interleaved codeword, the 6th bit group of the codeword becomes the 3rd bit group of the interleaved codeword, . . . , the 33th bit group of the codeword becomes the 43th bit group of the interleaved codeword, and the 40th bit group of the codeword becomes the 44th bit group of the interleaved codeword.

In particular, the interleaving sequence of Equation 11 has been optimized for a case where 64-symbol mapping (NUC symbol mapping) is employed and an LDPC coder having a length of 16200 and a code rate of 3/15 is used.

Figure 7:
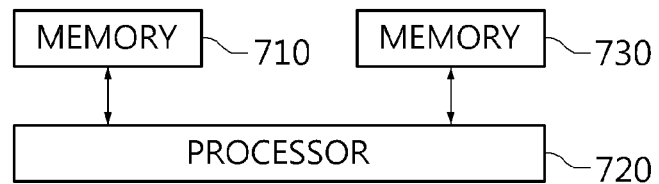
FIG. 7 is a block diagram illustrating a bit interleaver according to an embodiment of the present invention.

FIG. 7 is a block diagram illustrating a bit interleaver according to an embodiment of the present invention.

Referring to FIG. 7, the bit interleaver according to the present embodiment includes memories 710 and 730 and a processor 720.

The memory 710 stores an LDPC codeword having a length of 16200 and a code rate of 3/15.

The processor 720 generates an interleaved codeword by interleaving the LDPC codeword on a bit group basis corresponding to the parallel factor of the LDPC codeword.

In this case, the parallel factor may be 360. In this case, each of the bit groups may include 360 bits.

In this case, the LDPC codeword may be divided into 45 bit groups, as in Equation 9.

In this case, the interleaving may be performed using Equation 10 using permutation order.

In this case, the permutation order may correspond to the interleaving sequence represented by Equation 11.

The memory 730 provides the interleaved codeword to a modulator for 64-symbol mapping.

In this case, the modulator may be a symbol mapping device performing NUC (Non-Uniform Constellation) symbol mapping.

The memories 710 and 730 may correspond to various types of hardware for storing a set of bits, and may correspond to a data structure, such as an array, a list, a stack, a queue or the like.

In this case, the memories 710 and 730 may not be physically separate devices, but may correspond to different addresses of a physically single device. That is, the memories 710 and 730 are not physically distinguished from each other, but are merely logically distinguished from each other.

The error-correction coder 13 illustrated in FIG. 1 may be implemented in the same structure as in FIG. 7.

That is, the error-correction coder may include memories and a processor. In this case, the first memory is a memory that stores an LDPC codeword having a length of 16200 and a code rate of 3/15, and a second memory is a memory that is initialized to 0.

The memories may correspond to $\lambda_i$ (i=0, 1, . . . , N−1) and $P_j$ (j=0, 1, . . . , $M_1+M_2-1$), respectively.

The processor may generate an LDPC codeword corresponding to information bits by performing accumulation with respect to the memory using a sequence corresponding to a parity check matrix (PCM).

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 3240 (=K), a first parity part $\lambda_K$, $\lambda_{K+1}, \lambda_{K+M_1-1}$ corresponding to a dual diagonal matrix included in the PCM and having a length of 1080 (=$M_1$=g), and a second parity part $\lambda_{K+M_1}, \lambda_{K+M_1+1}, \ldots, \lambda_{K+M_1+M_2-1}$ corresponding to an identity matrix included in the PCM and having a length of 11880 (=$M_2$).

In this case, the sequence may have a number of rows equal to the sum (3240/360+1080/360=12) of a value obtained by dividing the length of the systematic part, that is, 3240, by a CPM size L corresponding to the PCM, that is, 360, and a value obtained by dividing the length $M_1$ of the first parity part, that is, 1080, by 360.

As described above, the sequence may be represented by the above Sequence Table.

In this case, the second memory may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses, specified in respective rows of the sequence, with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the first memory and the second memory, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the first memory and the second memory after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

Figure 8:
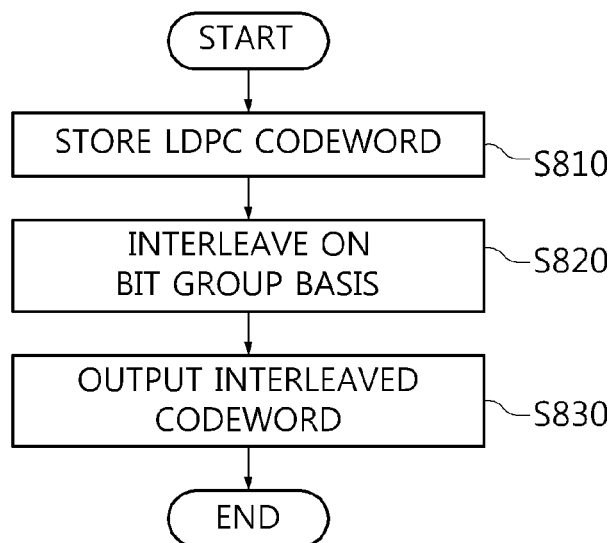
FIG. 8 is an operation flowchart illustrating a bit interleaving method according to an embodiment of the present invention.

FIG. 8 is an operation flowchart illustrating a bit interleaving method according to an embodiment of the present invention.

Referring to FIG. 8, in the bit interleaving method according to the present embodiment, an LDPC codeword having a length of 16200 and a code rate of 3/15 is stored at step S810.

In this case, the LDPC codeword may be represented by ($u_0, u_1, \ldots, u_{N_{ldpc}-1}$) (where $N_{ldpc}$ is 16200), and may be divided into 45 bit groups each composed of 360 bits, as in Equation 9.

Furthermore, in the bit interleaving method according to the present embodiment, an interleaved codeword is generated by interleaving the LDPC codeword on a bit group basis at step S820.

In this case, the size of the bit group may correspond to the parallel factor of the LDPC codeword.

In this case, the interleaving may be performed using Equation 10 using permutation order.

In this case, the permutation order may correspond to the interleaving sequence represented by Equation 11.

In this case, the parallel factor may be 360, and each of the bit groups may include 360 bits.

In this case, the LDPC codeword may be divided into 45 bit groups, as in Equation 9.

Moreover, in the bit interleaving method according to the present embodiment, the interleaved codeword is output to a modulator for 64-symbol mapping at step 830.

In accordance with at least one embodiment of the present invention, there is provided an intra-BICM bit interleaver that can effectively distribute burst errors occurring in a broadcasting system channel.

In accordance with at least one embodiment of the present invention, there is provided a bit interleaver that is optimized for an LDPC coder having a length of 16200 and a code rate of 3/15 and a modulator performing 64-symbol mapping and, thus, can be applied to next-generation broadcasting systems, such as ATSC 3.0.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A method of transmitting a broadcasting signal, comprising:

storing a low-density parity check (LDPC) codeword having a length of 16200 and a code rate of 3/15;

generating an interleaved codeword by interleaving the LDPC codeword on a bit group basis, the size of the bit group corresponding to a parallel factor of the LDPC codeword;

performing 64-symbol mapping for generating the broadcasting signal after generating the interleaved codeword; and transmitting the broadcasting signal over a physical channel, wherein the interleaving is performed using the following equation using permutation order:

$Y_j = X_{\pi(j)} 0 \leq j < N_{group}$ where $X_{\pi(j)}$ is the $\pi(j)$th bit group, $Y_j$ is an interleaved j-th bit group, $N_{group}$ is the number of bit groups, and $\pi(j)$ is a permutation order for bit group-based interleaving, wherein the permutation order corresponds to an interleaving sequence represented by the following interleaving sequence={19 34 22 6 29 25 23 36 7 8
24 16 27 43 11 35 5 28 13 4 3 17 15 38 20 0
26 12 1 39 31 41 44 30 9 21 42 18 14 32 10 2
37 33 40}, wherein the interleaving is performed by using the interleaving sequence before performing the 64-symbol mapping so as to distribute burst errors occurring in the broadcasting signal transmitted over the physical channel, wherein the LDPC codeword is encoded using a sequence corresponding to a parity check matrix (PCM), and wherein the sequence is represented by the following Sequence Table:

Sequence Table
1st row: 8 372 841 4522 5253 7430 8542 9822 10550 11896 11988
2nd row: 80 255 667 1511 3549 5239 5422 5497 7157 7854 11267
3rd row: 257 406 792 2916 3072 3214 3638 4090 8175 8892 9003
4th row: 80 150 346 1883 6838 7818 9482 10366 10514 11468 12341
5th row: 32 100 978 3493 6751 7787 8496 10170 10318 10451 12561
6th row: 504 803 856 2048 6775 7631 8110 8221 8371 9443 10990
7th row: 152 283 696 1164 4514 4649 7260 7370 11925 11986 12092
8th row: 127 1034 1044 1842 3184 3397 5931 7577 11898 12339 12689
9th row: 107 513 979 3934 4374 4658 7286 7809 8830 10804 10893
10th row: 2045 2499 7197 8887 9420 9922 10132 10540 10816 11876
11th row: 2932 6241 7136 7835 8541 9403 9817 11679 12377 12810
12th row: 2211 2288 3937 4310 5952 6597 9692 10445 11064 11272.

2. The method of claim 1 wherein the parallel factor is 360, and the bit group includes 360 bits.

3. The method of claim 2, wherein the LDPC codeword is represented by $(u_0, u_1, \ldots, u_{N_{ldpc}-1})$ (where $N_{ldpc}$ is 16200), and is divided into 45 bit groups each including 360 bits, as in the following equation:

$$X_j = \{u_k | 360 \times j \leq k < 360 \times (j+1), 0 \leq k < N_{ldpc}\} \text{ for } 0 \leq j < N_{group}$$

where $X_j$ is an j-th bit group, $N_{ldpc}$ is 16200, and $N_{group}$ is 45, u is the LDPC codeword, k is a bit index, and j is a group index.

4. A bit-interleaved coded modulation (BICM) reception method, comprising:
performing demodulation corresponding to 64-symbol mapping after receiving a broadcasting signal;
performing group-unit deinterleaving on interleaved values after the demodulation; and
restoring information bits by low-density parity check (LDPC) decoding deinterleaved values generated based on the group-unit deinterleaving, the deinterleaved values corresponding to a LDPC codeword having a length of 16200 and a code rate of 3/15,
wherein the group-unit deinterleaving is performed on a group basis, the size of the group corresponding to a parallel factor of the LDPC codeword,
wherein the group-unit deinterleaving corresponds to a reverse process of interleaving performed corresponding to the following equation using permutation order:

$$Y_j = X_{\pi(j)}, 0 \leq j < N_{group}$$

where $X_{\pi(j)}$ is a $\pi(j)$th bit group, $Y_j$ is an interleaved j-th bit group, $N_{group}$ is the number of bit groups and $\pi(j)$ is the permutation order for the interleaving, and
the permutation order corresponds to an interleaving sequence represented by the following interleaving sequence={19 34 22 6 29 25 23 36 7 8 24 16 27 43 11 35 5 28 13 4 3 17 15 38 20 0 26 12 1 39 31 41 44 30 9 21 42 18 14 32 10 2 37 33 40} and wherein the interleaving is performed corresponding to the interleaving sequence so as to distribute burst errors occurring in the broadcasting signal when the broadcasting signal is transmitted over a physical channel,
wherein the LDPC codeword is encoded using a sequence corresponding to a parity check matrix (PCM), and
wherein the sequence is represented by the following Sequence Table:

Sequence Table
1st row: 8 372 841 4522 5253 7430 8542 9822 10550 11896 11988
2nd row: 80 255 667 1511 3549 5239 5422 5497 7157 7854 11267
3rd row: 257 406 792 2916 3072 3214 3638 4090 8175 8892 9003
4th row: 80 150 346 1883 6838 7818 9482 10366 10514 11468 12341
5th row: 32 100 978 3493 6751 7787 8496 10170 10318 10451 12561
6th row: 504 803 856 2048 6775 7631 8110 8221 8371 9443 10990
7th row: 152 283 696 1164 4514 4649 7260 7370 11925 11986 12092
8th row: 127 1034 1044 1842 3184 3397 5931 7577 11898 12339 12689
9th row: 107 513 979 3934 4374 4658 7286 7809 8830 10804 10893
10th row: 2045 2499 7197 8887 9420 9922 10132 10540 10816 11876
11th row: 2932 6241 7136 7835 8541 9403 9817 11679 12377 12810
12th row: 2211 2288 3937 4310 5952 6597 9692 10445 11064 11272.

5. The BICM reception method of claim 4, wherein the parallel factor is 360, and the group includes 360 values.

6. The BICM reception method of claim 5, wherein the LDPC codeword is represented by $(u_0, u_1, \ldots, u_{N_{ldpc}-1})$, and the group corresponds to a bit group of the LDPC codeword in the following equation:

$$X_j = \{u_k | 360 \times j \leq k < 360 \times (j+1), 0 \leq k < N_{ldpc}\} \text{ for } 0 \leq j < N_{group}$$

where $X_j$ is an j-th bit group, $N_{ldpc}$ is 16200, u is the LDPC codeword, k is a bit index and j is a group index, and $N_{group}$ is 45.

* * * * *